United States Patent
He et al.

(10) Patent No.: US 7,800,170 B1
(45) Date of Patent: Sep. 21, 2010

(54) POWER MOSFET DEVICE WITH TUNGSTEN SPACER IN CONTACT HOLE AND METHOD

(75) Inventors: Zeng-Yi He, Shanghai (CN); Xiao-Ming Sui, Shanghai (CN); Jian Wang, Shanghai (CN); Si-Jie Shen, Shanghai (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 12/533,319

(22) Filed: Jul. 31, 2009

(51) Int. Cl.
H01L 29/78 (2006.01)

(52) U.S. Cl. .............................. 257/330; 257/E21.421; 438/270

(58) Field of Classification Search ......... 257/330–333, 257/500, 501, 509, 510, E21.421; 438/270, 438/271, 587–588
See application file for complete search history.

(56) References Cited

U.S. PATENT DOCUMENTS

| | | | |
|---|---|---|---|
| 4,617,193 A | 10/1986 | Wu | |
| 5,100,823 A | 3/1992 | Yamada | |
| 5,233,215 A | 8/1993 | Baliga | |
| 5,349,224 A | 9/1994 | Gilbert et al. | |
| 5,350,934 A | 9/1994 | Matsuda | |
| 5,430,324 A | 7/1995 | Bencuya | |
| 5,783,462 A | 7/1998 | Huang | |
| 5,914,512 A | 6/1999 | Huang | |
| 5,920,088 A | 7/1999 | Augusto | |
| 6,004,839 A | 12/1999 | Hayashi et al. | |
| 6,462,376 B1 | 10/2002 | Wahl et al. | |
| 6,639,275 B2 | 10/2003 | Ninomiya | |
| 6,864,533 B2 | 3/2005 | Yasuhara et al. | |
| 7,211,862 B2 * | 5/2007 | Nakazawa et al. | 257/330 |
| 7,230,297 B2 * | 6/2007 | Ono et al. | 257/330 |
| 7,344,923 B2 * | 3/2008 | Hofmann et al. | 438/128 |
| 7,358,143 B2 * | 4/2008 | Uno et al. | 438/296 |
| 7,459,749 B2 * | 12/2008 | Yoshimochi | 257/332 |
| 7,679,136 B2 * | 3/2010 | Kachi et al. | 257/330 |
| 2006/0081919 A1 * | 4/2006 | Inoue et al. | 257/330 |
| 2006/0091452 A1 * | 5/2006 | Wu | 257/330 |
| 2006/0273384 A1 * | 12/2006 | Hshieh | 257/330 |
| 2007/0018243 A1 * | 1/2007 | Ono et al. | 257/330 |
| 2008/0001220 A1 * | 1/2008 | Bhalla et al. | 257/330 |
| 2009/0315104 A1 * | 12/2009 | Hsieh | 257/330 |

* cited by examiner

*Primary Examiner*—Nathan W Ha
(74) *Attorney, Agent, or Firm*—Chein-Hwa Tsao; CH Emily LLC

(57) ABSTRACT

The present invention discloses a power MOSFET device with an added tungsten spacer in its contact hole, and manufacturing methods for the device. The features of the device are as follows: It includes trench gate isolated in trench and source/body contacts formed in the contact hole, and the tungsten spacer between Ti/TiN barrier layer and aluminum metal layer, the tungsten spacer is deposited on the bottom corners of the contact hole to cover its bottom corners. The addition of tungsten spacer to the bottom corners of the contact hole can effectively eliminate the presence of pits at the corners and junction spiking due to poor step-coverage of the Ti/TiN barrier layer otherwise leading to direct contact of silicon with aluminum. Thus, the present invention prevents a power MOSFET device from failures due to Idss leakage thus insuring high device quality and yield.

19 Claims, 5 Drawing Sheets

POWER MOSFET DEVICE WITH TUNGSTEN SPACER IN CONTACT HOLE AND METHOD

CROSS REFERENCE TO RELATED APPLICATIONS

1. Field of Invention

This invention relates to the field of semiconductor device structure and manufacturing, more specifically the present invention is directed to a power MOSFET (Metal-Oxide-Silicon Field-Effect Transistor) device with tungsten spacers in contact holes and its manufacturing method.

2. Background of the Invention

FIG. 1 shows a prior art structural diagram and some of its related manufacturing process of a power MOSFET device. The prior art MOSFET device has a drain region at the bottom of a substrate 1' and a body region 2' formed on top of the substrate 1'. A plurality of trenches of a certain depth are formed which run through the body region 2' and extend to the drain. Disposed inside the trenches are a trench gate 3' and a thin gate insulation layer 31', placed along trench sidewalls and bottoms, that insulates the trench gate 3' from the substrate 1' and the body region 2'. A number of source regions 4' are formed inside the body region 2' and around a top portion of the trench gate 3'. A low temperature oxide layer 5' and a borophosphosilicate glass (BPSG) layer 6' are successively deposited atop the body region 2', the source region 4' and the trench gate 3'.

Etching the low temperature oxide layer 5' and BPSG layer 6' forms contact holes 7' running through the layers. Although not shown here, additional contact holes are also formed via etching in the body region 2', the source region 4' and the trench gate 3'. An aluminum layer 10' is then deposited on the top surface of the BPSG layer 6' and in the contact holes 7'.

Owing to solid solubility of silicon in aluminum, silicon will migrate and dissolve into aluminum causing a phenomenon called junction spiking wherever aluminum comes into direct contact with silicon during the aluminum deposition process. Within the contact hole 7' area and below the dielectric layers, these places include aluminum-body region 2' contact, aluminum-source region 4' contact and the aluminum-trench gate 3' contact. Junction spiking will cause undesirable current leakage, or even worse cause short circuit between source and drain (Idss short circuit) in the MOSFET device thus degrading product quality.

To avoid junction spiking during the prior art manufacturing process for the power MOSFET device, Ti/TiN is generally used to form a barrier layer between silicon and aluminum to prevent their direct contact. As shown in FIG. 1, the prior art manufacturing process deposits a Ti/TiN barrier layer 8' on the top surface of BPSG layer 6' and the inner surface of contact hole 7', then deposits the aluminum layer 10' overlaying the Ti/TiN barrier layer 8' to fill the contact hole 7' thus preventing a direct contact between silicon and aluminum. As illustrated in FIG. 2, the detailed processing steps are as follows:

First, etch the low temperature oxide layer 5' and BPSG layer 6' to form contact holes 7' running through the layers in body region 2', source region 4' and trench gate 3'. Next, deposit the Ti/TiN barrier layer 8' on the top surface of BPSG layer 6' and the inner surface of contact hole 7'. Afterwards, deposit the aluminum layer 10' on the Ti/TiN barrier layer 8'. Finally, etch the aluminum layer 10' and the Ti/TiN barrier layer 8' into their respective desired patterns. In this way, the Ti/TiN barrier layer 8' can be used to avoid junction spiking due to direct contact between silicon and aluminum.

However, an unintended problem caused by the prior art technology is that pits may form at the bottom corner 71' of the contact hole 7' due to the nature of poor step-coverage of Ti/TiN barrier layer 8'. As a result, junction spiking may still occur at the bottom corner 71' where the Ti/TiN barrier layer 8' fails to prevent direct contact between silicon and aluminum.

With current advanced semiconductor manufacturing technology, the overall size of a MOSFET device can usually be reduced by improving the integration level of the device. For example, the wall-to-wall pitch size of some present day MOSFET is only about 1 micron, resulting in correspondingly small contact-hole-size and shallow source region/body region depth. Thus, at a pitch size of about 1 micron and below, poor step-coverage of the Ti/TiN barrier layer will cause more junction spiking due to presence of pits at the bottom corners of the contact holes. As a consequence, under present day manufacturing technology of semiconductor MOSFET devices with pitch size of about 1 micron and below, junction spiking has become a highly serious problem affecting MOSFET product quality and manufacturing yield. Therefore, an improved structure of the power MOSFET device and associated manufacturing method are desired to avoid junction spiking at the bottom corner of the contact hole to improve MOSFET product quality and manufacturing yield.

SUMMARY OF INVENTION

The main object of the present invention is to provide an improved power MOSFET device and its manufacturing method while avoiding junction spiking by depositing a tungsten spacer in the contact hole that effectively prevents the semiconductor power MOSFET from failure due to Idss leakage and short circuit, hence insuring the product quality.

More specifically, the present invention power MOSFET device with tungsten spacer includes:

A body region disposed on the top of a substrate.

Trench gates located inside trenches opened through the body region into the substrate.

Source regions formed on top portions of the body region and around the trench gate.

A dielectric layer formed on top surface of the trench gate and source regions insulating the gate from the source, the body and the substrate.

Contact holes formed through the dielectric layer.

A first barrier layer formed on top surface of the dielectric layer, the side wall and bottom surface of the contact holes. In one embodiment the first barrier layer is a Ti/TiN barrier layer.

A tungsten layer disposed atop the first barrier layer at the bottom corners of the contact holes.

An aluminum contact metal layer disposed atop the tungsten layer and the first barrier layer. The aluminum contact metal layer fills the contact holes and extends to the top surface of the dielectric layer to form a desired contact metal layer. In addition to aluminum, the contact metal layer may include copper or other elements.

Moreover, the power MOSFET device includes a gate runner area with a gate runner trench located inside. The gate runner area is formed together with the trench gate and has substantially the same structure as the latter, but is wider and deeper than the latter. A contact hole, formed in the gate runner area, may be disposed either on top surface of the gate runner trench or inside the gate runner trench with bottom of the contact hole extends to the interior of the gate runner trench.

As an alternative embodiment, a plurality of contact holes can be formed in the cell area adjacent to the gate runner area. When the upper part of the body region is not fully covered by the source region, namely, when a top portion of the body region extends to the upper surface of the semiconductor, the contact holes can be disposed inside the body region or on top surface of the body region with the bottom of the contact hole extends to the interior of the body region. Alternatively, the contact holes can be disposed on top surfaces of the body region and the source region. When the upper part of the body region is fully covered by the source region, the contact hole can be made to go through the source region with its bottom extends to the interior of the body region.

The tungsten layer may be formed into wing-shaped spacers to cover the first barrier layer at bottom portion of the contact-hole-sidewall and at both sides of the contact hole bottom surface, as well as covering the bottom corners of the contact hole. The first barrier layer at middle section of the bottom surface of the contact holes is exposed to make direct contact with the contact metal layer.

Alternatively the first barrier layer at lower portions of the contact-hole-sidewalls and across the whole bottom surface of contact hole may be covered with the tungsten layer. In this case, instead of forming wing-shaped tungsten spacers, the tungsten layer is formed into a tungsten plug covering the bottom corners and bottom surface of the contact hole.

A thin gate insulation layer, formed along the trench side walls and bottom, is disposed inside the trench and located between the trench gate, body region, source region and drain region.

In one embodiment, the dielectric layer includes a low temperature oxide layer and a BPSG layer, which are in turn deposited atop the body region, trench gate and source region.

A manufacturing method for the present invention Power MOSFET Device with tungsten spacer in contact hole includes the following steps:
  a) Form a body region layer on top of a substrate.
  b) Form a trench gate penetrating through the body region into the substrate.
  c) Form a dielectric layer between trench gate and body region.
  d) Form a source region on top portion of the body region and surrounding the trench gate.
  e) Form a plurality of contact holes through the dielectric layer by etching the dielectric layer then depositing a Ti/TiN barrier layer on top surface of the dielectric layer, on the side walls and on the bottom surfaces of the contact holes.
  f) Form tungsten material over the barrier layer in the contact hole.
  g) Form an aluminum layer overlaying the barrier layer and the tungsten material.
  h) Form source contact metal layer and gate contact metal layer by etching the aluminum layer and the barrier layer.

For those power MOSFET devices with a trench gate runner formed together with trench gate, a gate runner area is also simultaneously formed in step b) that includes a trench gate runner.

Of the contact holes formed in step e), one contact hole is formed in the gate runner area. This contact hole can be disposed either on top surface of the trench gate runner or inside the trench gate runner with the contact hole bottom extends to the interior of the gate runner trench. As another embodiment here, a plurality of contact holes are formed in the cell area adjacent to the gate runner area. When the upper portion of the body region is not fully covered by the source region, these contact holes can be disposed on top surface of the body region or inside the body region with the bottom of contact holes extended to the interior of the body region. Alternatively, these contact holes can be disposed on top surfaces of the body region and the source region. When the upper portion of the body region is fully covered by the source region, these contact holes can be made to go through the source region with their bottom extended to the interior of the body region.

As a more detailed embodiment, step f) includes the following sub-steps:
  f1) Deposit, via chemical vapor deposition, a tungsten layer over the barrier layer so as to overfill the contact hole opening.
  f2) Etch back the tungsten layer till it levels with the barrier layer surface. That is, etch off the portion of tungsten layer that protrudes above the contact hole opening.
  f3) Continue to over-etch the tungsten layer so as to form wing-shaped tungsten spacers atop the barrier layer at the bottom corners of the contact hole.

The wing-shaped tungsten spacers formed in step f3) can be made to cover the first barrier layer at bottom portion of the contact-hole-sidewalls and the first barrier layer at both sides of the contact-hole-bottom surface so as to cover the bottom corners of the contact hole. However, the first barrier layer at middle sections of the contact-hole-bottom surface is now exposed to make direct contact with the metal layer. As an alternative, etching can be terminated after step of f2) so as to form a V-shaped tungsten plug. The tungsten plug covers the first barrier layer at bottom portion of the contact-hole-sidewall and the first barrier layer across the whole bottom surface of contact hole. The tungsten plug also covers the bottom corners and the bottom surface of contact hole.

As an option, a second barrier layer can be formed atop the tungsten spacer with an additional step inserted between steps f) and g).

As another option, Copper or other elements can be added to the aluminum layer during step g).

To briefly summarize, the present invention provides the following benefits:

Addition of the tungsten spacer atop a Ti/TiN barrier layer at bottom corners of the contact hole of a power MOSFET device can effectively prevent junction spiking due to an otherwise poor step-coverage of the Ti/TiN barrier layer leading to direct contact between silicon and aluminum. Consequently, the present invention avoids associated undesirable device leakage and Idss short circuit thus insuring product quality.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 1:
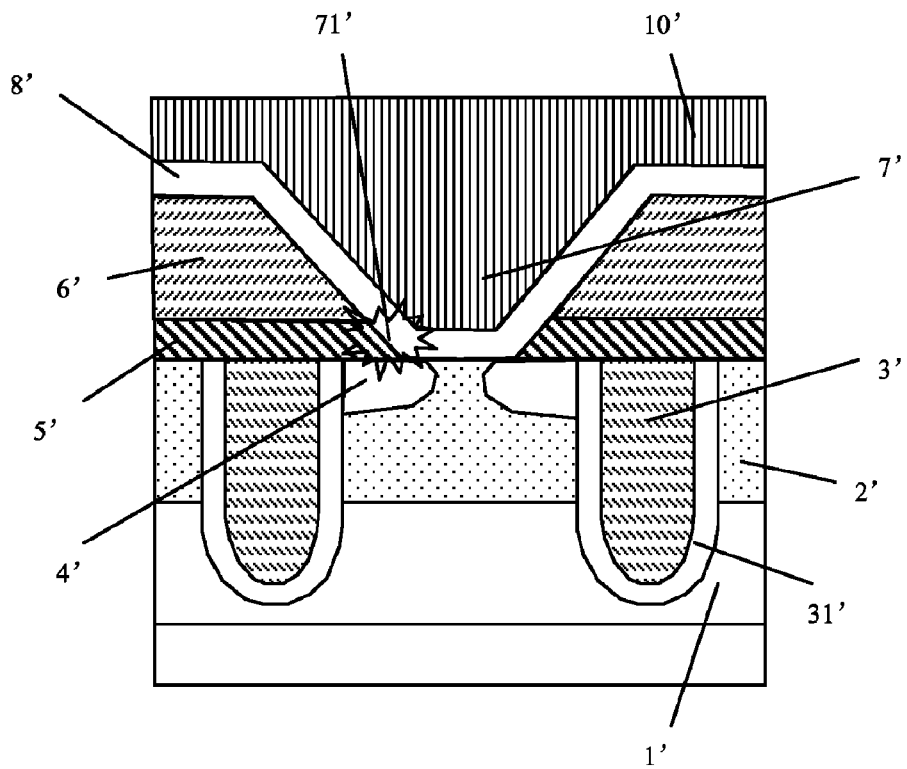
FIG. 1 is a cross sectional illustration of using a Ti/TiN barrier layer in the contact hole of a power MOSFET device to avoid junction spiking in prior art.
Figure 2:
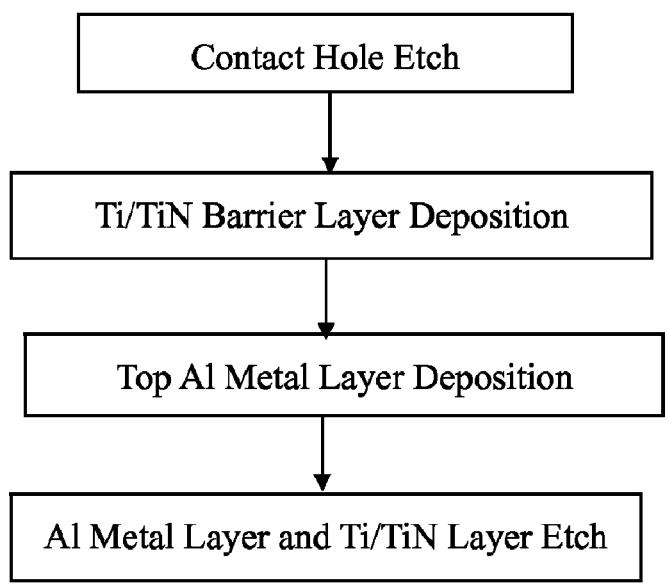
FIG. 2 is a flow chart illustration of depositing a Ti/TiN barrier layer in the contact hole of a power MOSFET device in prior art.
Figure 3:
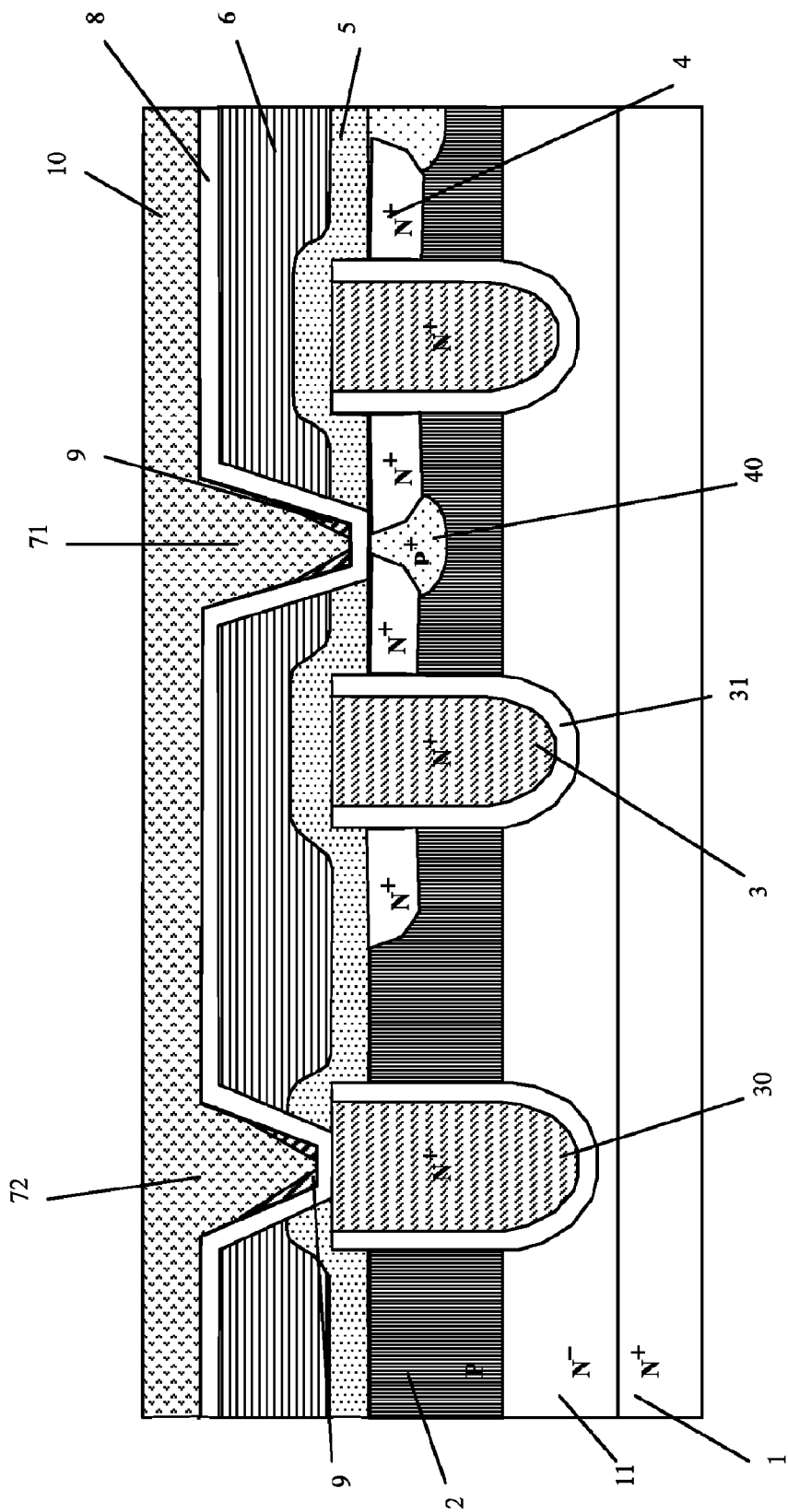
FIG. 3 is an embodiment of the present invention in sectional view for a power MOSFET device with wing-shaped tungsten spacer in the contact hole.

With reference made to FIGS. 3, 4, 5 and 6A-6E, the numerous embodiments of the present invention are presently described:

FIG. 3 is an embodiment of the present invention in sectional view for a power MOSFET device with wing-shaped tungsten spacer in the contact hole. In this case, the power MOSFET is an N− channel MOSFET device having a highly doped N+ substrate 1 as the drain. Atop the N+ substrate 1 is an N− epitaxial layer 11 on which a P-body region 2 is formed. In the art, the highly doped N+ substrate 1 together with the N− epitaxial layer 11 are frequently referred to as substrate in general without further differentiation. A plurality of trenches of pre-determined depth are disposed where they run through the P-body region 2 and extend to the N− epitaxial layer 11. A thin gate insulation layer 31' is disposed along the trench sidewalls and across the trench bottom. The rest of the trenches are then filled with an electrically conductive material like polysilicon to form a trench gate 3. The gate insulation layer 31' is usually made of a thermal oxide to insulate the trench gate 3 from the N− epitaxial layer 11 and P− body region 2. Numerous N+ source regions 4 are formed on top of the P− body region 2 and around each trench. The gate insulation layer 31' also insulates N+ source region 4 from trench gate 3. A dielectric layer formed by low temperature oxide layer 5 and BPSG layer 6 is deposited on the top surfaces of body region 2, N+ source region 4 and trench gate 3. The dielectric layer insulates gate 3 to prevent it from shorting to P-body region 2 and N+ source region 4. The power MOSFET device also has a gate runner area with a trench gate runner 30 inside. The trench gate runner 30 is formed together with the trench gate 3 and has substantially the same structure as the latter but is wider and deeper than the it.

Contact holes are formed through the low temperature oxide layer 5 and BPSG layer 6. Specifically, a plurality of contact holes 71 are formed in the device cell area. Due to extension of the P-body regions to the upper surface of the semiconductor device, contact holes 71 may be formed on the top surface of P-body region 2 and a contact implantation area P+ 40 can be optionally added to reduce the contact resistance between P-body region 2 and metal layer. In any case, at least one contact hole 72 is formed in the gate runner area, namely, on the top surface of trench gate runner 30. The contact holes 71 and 72 may also extend to the interior of P-body region or trench gate runner 30 (see FIG. 4).

A Ti/TiN barrier layer 8 is disposed on the top surface of the BPSG layer 6 and the inner surfaces of the contact holes 71 and 72 (namely, along the side walls and bottom surfaces of the contact holes). Wing-shaped tungsten spacers 9 are then disposed on the Ti/TiN barrier layer 8 at the bottom corners of the contact holes 71 and 72. An aluminum layer 10 is disposed on the tungsten spacer 9 and the Ti/TiN barrier layer 8 to fill most of the space of the contact holes 71 and 72. The aluminum layer 10 also extends to the top surface of the dielectric layer to form source and body area contact metal layer and gate contact metal layer. The aluminum layer 10 composition may contain copper or other elements as well.

Figure 6A:
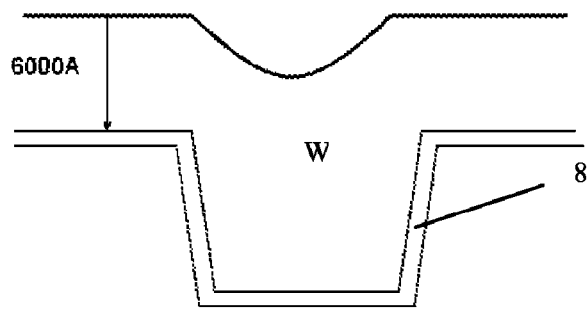
FIG. 6A through FIG. 6E illustrate a procedure of depositing tungsten in the contact hole of a power MOSFET device according to the present invention.
Figure 6B:
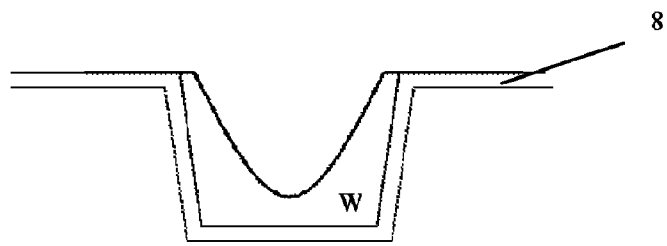
Figure 6C:
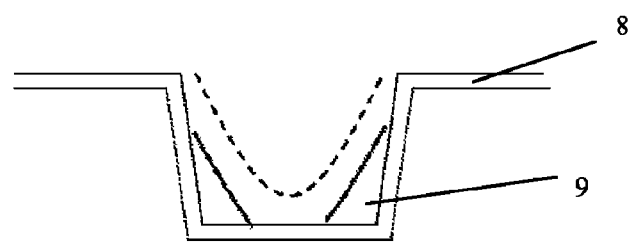

When the contact holes 71 and 72 are wide and shallow, the tungsten spacers 9 formed on the Ti/TiN barrier layer 8 at their bottom corners take up a wing shape (see FIG. 6C). That is, the tungsten spacers cover:

1. The Ti/TiN barrier layer 8 at the bottom of side walls of the contact holes 71 and 72.
2. The Ti/TiN barrier layer 8 at both sides of the bottom surfaces of the contact holes 71 and 72.
3. Two bottom corners of the contact holes 71 and 72.

However, the tungsten spacers leave the Ti/TiN barrier layer 8 at the middle section of the bottom surface of contact holes exposed. Consequently, the aluminum layer 10 fills the area between the wing-shaped tungsten spacers at the bottom of contact holes while making direct contact with the exposed Ti/TiN barrier layer 8 at the middle section of the bottom surface of contact holes. Meanwhile, the aluminum layer 10 also fills the area above the tungsten spacers and extends over the top surface of the dielectric layer to form source and body area contact metal layer and gate contact metal layer.

As a better contact is made between the aluminum layer and the Ti/TiN barrier layer than that between the aluminum layer and the tungsten spacer, in general the smaller the fractional surface area of barrier layer covered by the tungsten spacer the better. However, when the contact holes 71 and 72 are narrow and deep, the tungsten material at the bottom of the contact holes may not be easy to remove. In this case, a V-shaped tungsten plug 9 is formed on the Ti/TiN barrier layer 8 at the bottom of contact holes instead (see FIG. 6D). That is, the V-shaped tungsten plug 9 covers:

1. Ti/TiN barrier layer 8 at the lower part of the side walls of contact holes 71 and 72.
2. Ti/TiN barrier layer 8 across the whole bottom surface of the contact holes 71 and 72.
3. Two bottom corners and the whole bottom surface of contact holes 71 and 72.

Consequently, the aluminum layer 10 fills the space surrounded by the V-shaped tungsten plug at the bottom of the contact holes. Meanwhile, the aluminum layer 10 also fills the area above the tungsten plug of the contact holes while making direct contact with exposed Ti/TiN barrier layer 8 covering the side walls near the top of the contact holes 71 and 72. The aluminum layer 10 further extends over the top surface of the dielectric layer to form source and body area contact metal layer and gate contact metal layer. As an optional scheme, a second Ti/TiN barrier layer can be disposed between the V-shaped tungsten plug and the aluminum layer 10 to improve the contact between the aluminum layer 10 and the tungsten plug. In this case, the shape of tungsten plug is not confined to a V-shape and can instead be made into a square-shape or U-shape.

Figure 4:
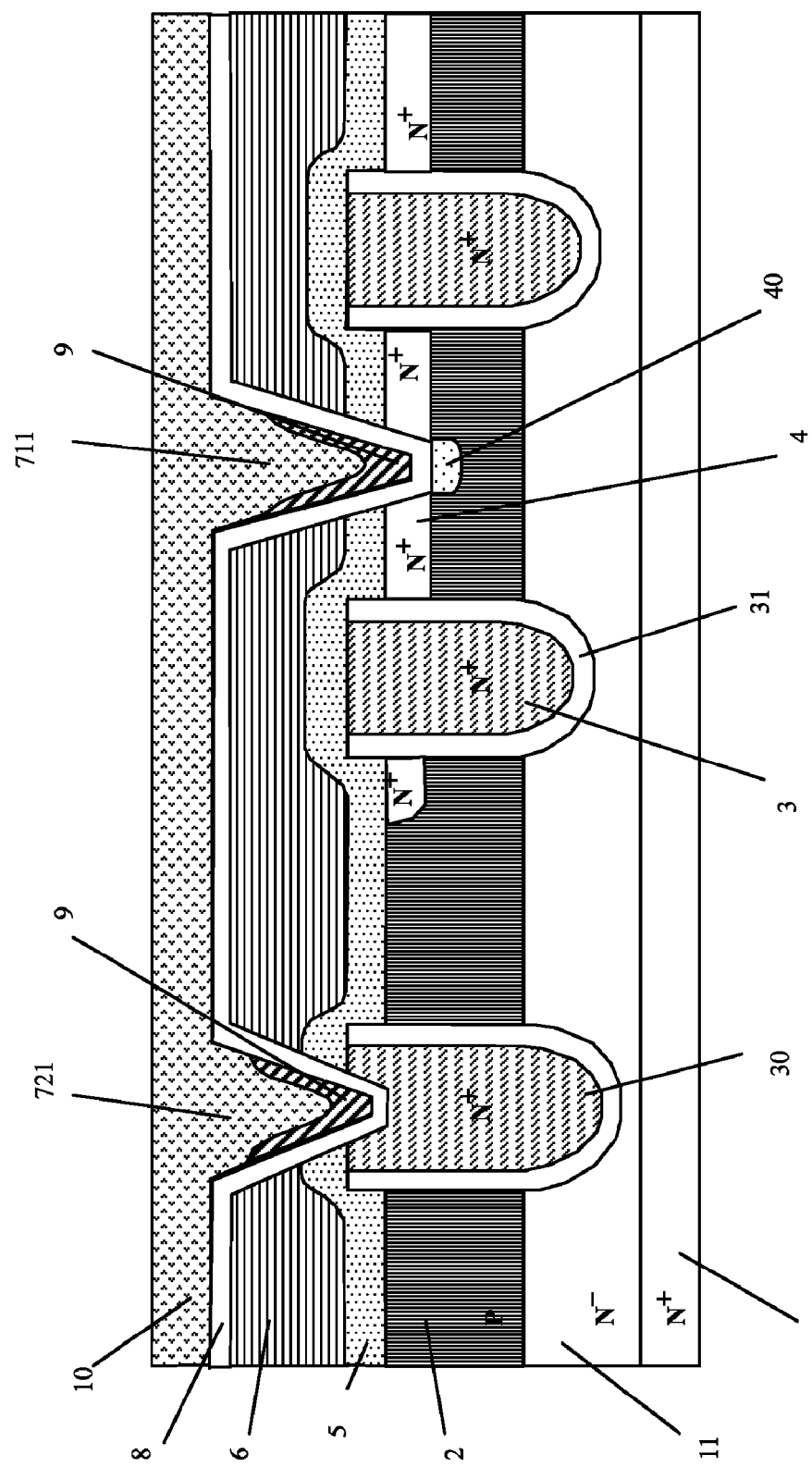
FIG. 4 is another embodiment of the present invention in sectional view for a power MOSFET device with V-shaped tungsten plug in the contact hole.

FIG. 4 is a sectional view of another embodiment of the present invention for the power MOSFET device with wing-shaped tungsten spacers added in the contact holes. Here, the structure of the MOSFET device is similar to that shown in FIG. 3. However, the difference is that:

(A) In FIG. 3 the contact holes 71 and 72 are formed on the silicon surface. That is, the bottom surfaces of the contact holes 71 are located respectively at the top surface of P body region 2 and N+ source region 4 and the bottom surface of the contact hole 72 is located at the top surface of trench gate 3.

(B) In FIG. 4 the contact holes are formed inside the silicon, hence they are also called trench contact holes. Thus, the P body region is fully covered by the upper source region. To make good contact between the source at device cell area and the P body area, contact hole 711 can be made to go through the source region to extend its bottom to the P body region 2, and further improved by adding an optional contact implantation area P+ 40. The contact hole 721 of trench gate runner extends to some depth in the runner trench 30. Other than extending the trench contact hole to the interior of the silicon, the structure of the trench contact holes in FIG. 4 is similar to that embodied in FIG. 3. In the trench contact holes, the barrier layer 8 can be formed by Ti/TiN deposition, tungsten spacers 9 are then formed on the Ti/TiN barrier layer 8 at the bottom corners of the trench contact holes. Finally, the aluminum layer 10 is added forming source and body contact areas and a gate contact area. The aluminum layer 10 composition may contain copper or other elements as well.

When the contact holes 711 and 721 are wide and shallow, the tungsten spacers 9 formed on the Ti/TiN barrier layer 8 at their bottom corners take up a wing shape (see FIG. 6C). That is, the tungsten spacers 9 cover:

1. The Ti/TiN barrier layer 8 at the bottom of side walls of the contact holes 711 and 721.
2. The Ti/TiN barrier layer 8 at both sides of the bottom surfaces of the contact holes 711 and 721.
3. Two bottom corners of the contact holes 711 and 721.

However, the tungsten spacers 9 leave the Ti/TiN barrier layer 8 at the middle section of the bottom surface of contact holes exposed. Consequently, the aluminum layer 10 fills the area between the wing-shaped tungsten spacers at the bottom of contact holes while making direct contact with the exposed Ti/TiN barrier layer 8 at the middle section of the bottom surface of contact holes. Meanwhile, the aluminum layer 10 also fills the area above the tungsten spacers and extends over the top surface of the dielectric layer to form source and body area contact metal layer and gate contact metal layer.

However, when the contact holes 711 and 721 are narrow and deep, the tungsten material at the bottom of the contact holes may not be easy to remove. In this case, a V-shaped tungsten plug 9 is formed on the Ti/TiN barrier layer 8 at the bottom of contact holes instead (see FIG. 6D). That is, the V-shaped tungsten plug 9 covers:

1. Ti/TiN barrier layer 8 at the lower part of the side walls of contact holes 711 and 721.
2. Ti/TiN barrier layer 8 across the whole bottom surface of the contact holes 711 and 721.
3. Two bottom corners and the whole bottom surface of contact holes 711 and 721.

Consequently, the aluminum layer 10 fills the space surrounded by the V-shaped tungsten plug at the bottom of the contact holes. Meanwhile, the aluminum layer 10 also fills the area above the tungsten plug of the contact holes while making direct contact with exposed Ti/TiN barrier layer 8 covering the side walls near the top of the contact holes 711 and 721. The aluminum layer 10 further extends over the top surface of the dielectric layer to form source and body area contact metal layer and gate contact metal layer. As an optional scheme, a second Ti/TiN barrier layer can be disposed between the V-shaped tungsten plug and the aluminum layer 10 to improve the contact between the aluminum layer 10 and the tungsten plug. In this case, the shape of tungsten plug is not confined to a V-shape and can instead be made into a square-shape or U-shape.

Turning now to the manufacturing process for an N-channel power MOSFET device of the present invention as described in the above embodiments. First, grow an N− epitaxial layer 11 on a highly doped N+ substrate 1, then form the P body region 2 by P-ion implantation and diffusion on the top of N− epitaxial layer 11. For example, implant boron ions into N− epitaxial layer 11 with an ion energy of 20-100 keV and a dosage of about $3\times10^{12} \sim 1\times10^{14}$ to form a shallow P body region 2. Next, form a trench hard mask made of silicon dioxide on the surface of P body region 2 and etch the N− epitaxial layer 11 to a preset depth to form the trenches using anisotropical etching through the trench mask and P body region 2. Along side walls and bottom of the trenches, use standard growth and etching process of a sacrificial oxide layer to form the gate insulation layer 31 made of thermal oxide, then deposit N+ doped polisilicon (DOPOS) to form the trench gate 3 in the residual space in trench and on the silicon dioxide trench hard mask. Afterwards, etch back N+ DOPOS till the silicon dioxide trench mask then lift off the trench mask. As an option, the P body region 2 can be implanted at this stage of the manufacturing process in stead of an earlier step. Subsequently, form N+ source region 4 (see FIG. 4) atop the P body region 2, or form N+ source region 4 (see FIG. 3) around the gate insulation layer 31 in the trench by using a source mask for an ion implant. Following activation of the source and body implantation at elevated temperature, successively deposit a low temperature oxide layer 5 and a BPSG layer 6 on the top of trench gate 3, source region 4 and P body region 2 thus forming a dielectric layer to insulate trench gate 3.

Figure 5:
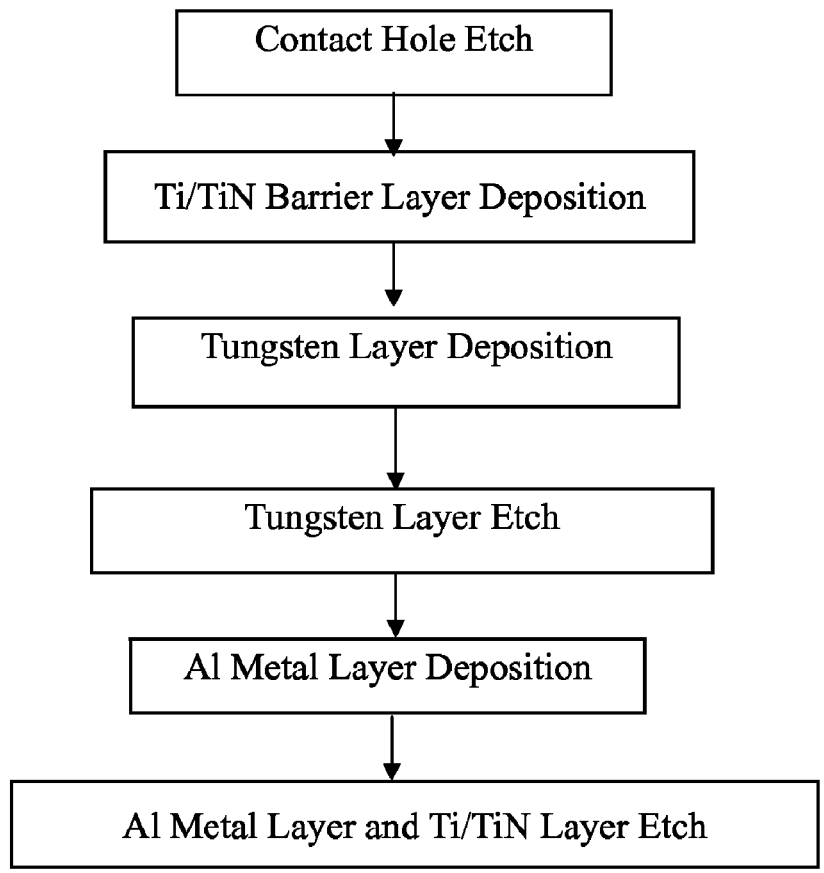
FIG. 5 is a flow chart illustration of depositing tungsten in the contact hole of a power MOSFET device according to the present invention.

As shown in FIG. 5, the detailed steps to produce tungsten spacers in contact holes of the power MOSFET device are as follows:

Form a plurality of contact holes through the low temperature oxide layer 5 and the BPSG layer 6 by etching these layers in the cell area. When the P body region extends to the upper surface of the semiconductor, the contact holes may be formed on the surface of P body region 2 (see the contact hole 71 in FIG. 3). However, when the P body region is fully covered by the upper source region, the contact holes can be made to go through the source region with their bottom extending to the interior of P body region 2 (see the contact hole 711 in FIG. 4). Meanwhile, at least one contact hole is formed in the gate runner area, namely, on the surface of the trench gate 3 (see the contact hole 72 in FIG. 3) with its bottom extending to the interior of the trench gate 3 (see the contact hole 721 in FIG. 4).

Next, a Ti/TiN barrier layer 8 is deposited on the top surface of BPSG 6, the side walls and the bottom surface of contact holes. As an option, a contact implantation area P+ 40 can be formed by ion implantation through the contact holes before or after deposition of the Ti/TiN barrier layer 8. Then, as shown in FIG. 6A, a tungsten layer is deposited over the Ti/TiN barrier layer 8 using chemical vapor deposition (CVD). The so deposited tungsten layer substantially fills the contact holes and may even be deposited higher than the contact hole opening by some thickness as desired. In one embodiment, the thickness is about 6000 A (angstrom) above the contact hole opening. The tungsten layer is then etched back till it levels with the surface of Ti/TiN barrier layer 8 (see FIG. 6B). As illustrated in FIG. 6C, the process continues to over etch the tungsten layer for a pre-determined amount of time so as to remove any residual tungsten material from the top surface of Ti/TiN barrier layer 8 and to simultaneously form the wing-shaped tungsten spacers 9. The thus formed wing-shaped tungsten spacers cover:

1. Ti/TiN barrier layer 8 at the lower part of the side walls of contact hole.
2. Ti/TiN barrier layer 8 at both sides of the bottom surface of contact hole.
3. Two bottom corners of the contact hole.

Consequently, Ti/TiN barrier layer 8 at the middle section of the bottom surface of contact hole is exposed to make direct contact with the top aluminum layer 10 formed by deposition in the follow-up process. Like before, the aluminum layer 10 can also contain copper or other elements.

Figure 6D:
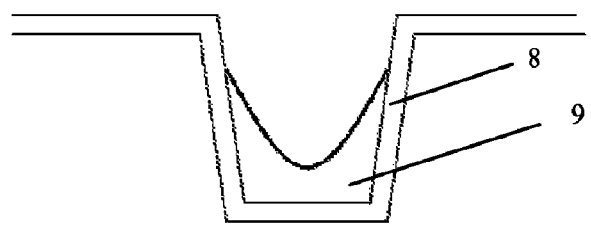
Figure 6E:
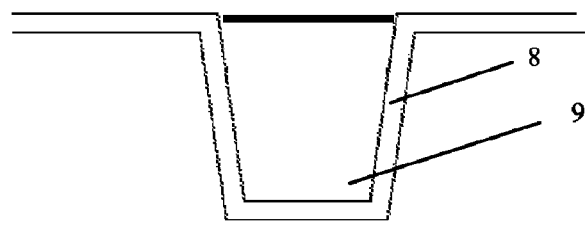

For the case where the contact hole is narrow, the above over etching does not etch off the tungsten material at the bottom center of the contact hole. The result is the formation of a V-shaped tungsten plug 9 as illustrated in FIG. 6D. The V-shaped tungsten plug 9 covers:

1. Ti/TiN barrier layer 8 at the lower part of the side walls of contact hole.
2. Ti/TiN barrier layer 8 across the whole bottom surface of the contact hole.
3. Two bottom corners and the whole bottom surface of contact hole.

Another optional scheme is as follows:

Following process completion till FIG. 6A, use a CMP (chemical mechanical polish) process to form a square-shaped tungsten plug (see FIG. 6E) or just etch to form a U-shaped tungsten plug (see FIG. 6B) then form a second Ti/TiN barrier layer by deposition. Under this option, the over etching steps as illustrated with FIG. 6C or FIG. 6D for the tungsten layer become discretional. That is, the second Ti/TiN barrier layer serves to improve the contact quality between the tungsten layer and the aluminum layer for the tungsten plug.

Finally, a top aluminum layer 10 is deposited on the Ti/TiN barrier layer and the tungsten layer 9 to fill the contact hole and to extend over the top surface of the dielectric layer. The aluminum layer 10 is then photoetched into a final desired metallization pattern of the MOSFET device. As remarked before, the aluminum layer 10 composition may contain copper or other elements. More specifically, after completion of photoetching the aluminum layer 10 and the Ti/TiN barrier layer 8, the aluminum layer 10 forms source contact metal layer at cell area and gate contact metal layer at the gate runner area. For other parts of the power MOSFET device, a standard commercial process can be used to complete them.

In the structure of power MOSFET device as described in the above embodiments of the present invention, the contact hole in the gate runner area is disposed in the trench gate (trench polysilicon). Even if the aluminum layer in the bottom corner area of the contact hole should contact the polysilicon in trench gate causing junction spiking, an associated Idss leakage and short circuit is unlikely to occur. This is because the gate insulation layer is disposed between the trench gate and the P body region, N+ source region and N− epitaxial layer, so even if junction spiking occurs, Idss leakage and short circuit will not occur. For this reason, failure of most MOSFET devices due to Idss leakage and short circuit are caused by those junction spikings taking place at the bottom of the contact hole in device cell area (namely, on P body region or P body region and N+ source region). Hence, for the contact holes disposed in device cell area and gate runner area, the present invention adds a tungsten spacer atop the Ti/TiN barrier layer at its bottom corners to effectively eliminate junction spiking due to direct contact between silicon and aluminum thus further improving device safety and insuring product quality.

To summarize, the present invention adds tungsten spacers at the bottom corners of the contact holes of a power MOSFET device. With the presence of tungsten spacers, when pits are formed at the bottom corners of the contact holes or when the Ti/TiN barrier layer has poor step-coverage, direct contact between the front aluminum layer and the body region or source region at the bottom corners of contact hole can be avoided. The tungsten spacers can also prevent direct contact between the gate aluminum layer and the trench gate at the bottom corners of gate contact hole. Therefore, Idss leakage and short circuit of the power MOSFET device caused by junction spiking due to direct contact between aluminum and silicon can be avoided. This invention is particularly beneficial to power MOSFET devices made of advanced structure and manufacturing process. Here, in order to improve the areal usage efficiency of semiconductor wafer through high density integration (usually the encapsulation size of the device is smaller), the MOSFET device has shallow source region, shallow body region and contact hole of higher depth-to-width ratio (i.e., the contact hole is relatively deeper and narrower). With the effective elimination of junction spiking in power MOSFET device, the present invention has been observed to improve product yield reaching about 99.9%.

To those skilled in the art, it should become clear by now that, despite the aforementioned specific embodiments, the present invention is not only applicable to N-channel power MOSFET devices and their manufacturing, but also applicable to, upon proper changes of semiconductor dopant types throughout the various device regions, P-channel power MOSFET devices and their manufacturing. Additionally, while the present invention has been described in detail with various preferred embodiments above, the above description shall not be considered as limiting the scope of the present invention. Within the scope of the present invention, after reviewing the above description, many diversified modifications and replacements to achieve similar device improvements should become obvious to those skilled in the art.

What is claimed is:

1. A power MOSFET device with a tungsten spacer in its contact hole, the power MOSFET device comprises:
   a substrate;
   a body region disposed atop the substrate;
   a plurality of trench gates formed in a corresponding plurality of trenches opened through the body region into the substrate;
   a plurality of source regions formed on a top portion of the body region around the trench gates;
   a dielectric layer formed atop the trench gate and the source regions;
   a plurality of contact holes formed through the dielectric layer;
   a first barrier layer formed on the side walls and bottom surfaces of the contact holes;
   a tungsten spacer disposed atop the first barrier layer at the bottom corners of the contact holes; and an aluminum contact metal layer disposed over the tungsten spacer and the first barrier layer, filling in the contact holes and extending onto the top surface of the dielectric layer.

2. The power MOSFET device of claim 1 wherein the tungsten spacer comprises wing-shaped spacers covering the bottom corners of the contact holes while exposing the first barrier layer in the middle section of the bottom surfaces of the contact holes for making a direct contact with the contact metal layer.

3. The power MOSFET device of claim 1 wherein the tungsten spacer comprises a V-shaped plug covering the first barrier layer at the bottom portion of the contact-hole-side wall and the first barrier layer at the bottom surface of contact holes hence covering the bottom corners and the bottom surface of contact holes.

4. The power MOSFET device of claim 1 further comprises a second barrier layer disposed between the tungsten spacer and the aluminum contact metal layer.

5. The power MOSFET device of claim 1 further comprises a gate runner area and a trench gate runner inside the gate runner area, where the trench gate runner is formed together with the trench gate and has substantially the same structure as the trench gate.

6. The power MOSFET device of claim 5 wherein the trench gate runner is wider and deeper than the trench gate.

7. The power MOSFET device of claim 5 wherein at least one contact hole is formed on the top surface of the trench gate runner inside the gate runner area.

8. The power MOSFET device of claim 5 wherein at least one contact hole is disposed inside the trench gate runner inside the gate runner area with the bottom of contact hole extending to the inside of the trench gate runner.

9. The power MOSFET device of claim 1 wherein an upper portion of the body region extends to the top surface not covered by the source region with the contact hole disposed on the top surface of the body region and the source region.

10. The power MOSFET device of claim 1 wherein the upper part of the body region is fully covered by the source region with the bottom of contact hole going through the source region and extending to the inside of the body region.

11. The power MOSFET device of claim 1 wherein said dielectric layer further comprises a low temperature oxide layer and a BPSG layer successively deposited on top of the trench gate and the source region.

12. The power MOSFET device of claim 1 wherein said first barrier layer is a Ti/TiN barrier layer.

13. The power MOSFET device of claim 1 wherein the composition of said aluminum contact metal layer further comprises copper.

14. A method for manufacturing a power MOSFET Device with a tungsten spacer in its contact hole, the method comprises the following steps:

a) providing a substrate with a body region layer atop;
b) opening a plurality of trenches through the body region into the substrate and forming a plurality of trench gates in the plurality of trenches;
c) forming source regions on a top portion of the body region and around the trench gate;
d) depositing a dielectric layer on top of the trench gate and the source regions;
e) opening a plurality of contact holes through the dielectric layer and disposing a first barrier layer on top surface of the dielectric layer, side walls and bottom surfaces of the contact holes;
f) disposing a tungsten spacer at the bottom corners of the contact holes while overlaying the first barrier layer;
g) disposing an aluminum contact metal layer on the first barrier layer and the tungsten spacer; and
h) forming a source contact metal layer and a gate contact metal layer by etching the aluminum contact metal layer and the first barrier layer.

15. The method of claim 14 wherein step f) further comprises:
  f1) depositing a tungsten layer on the first barrier layer in the contact holes such that the tungsten layer fills in and over the contact hole opening; and
  f2) etching back the tungsten layer till surface of the first barrier layer so as to remove a portion of the tungsten layer protruding above the contact hole opening.

16. The method of claim 15 wherein step f) further comprises:
  f3) continuing to over etch the tungsten layer to form the tungsten spacer atop the first barrier layer at the bottom corners of the contact hole.

17. The method of claim 15 wherein step f) further comprises:
  f3) continuing to over etch the tungsten layer to form wing-shaped spacers covering the bottom corners of the contact holes while exposing the first barrier layer in the middle section of the bottom surfaces of the contact holes for a direct contact with the contact metal layer later.

18. The method of claim 15 wherein step f) further comprises:
  f3) continuing to over etch the tungsten layer to form a V-shaped plug covering the first barrier layer at the bottom portion of the contact-hole-side walls and across the bottom surface of contact holes hence covering the bottom corners and the bottom surface of contact holes.

19. The method of claim 14 further comprises, between step f) and step g), the following step:
  forming a second barrier layer atop the tungsten spacer.

* * * * *